(12) United States Patent
Schroder et al.

(10) Patent No.: US 9,907,183 B2
(45) Date of Patent: *Feb. 27, 2018

(54) ELECTRICAL, PLATING AND CATALYTIC USES OF METAL NANOMATERIAL COMPOSITIONS

(71) Applicant: NCC NANO, LLC, Dallas, TX (US)

(72) Inventors: Kurt A. Schroder, Coupland, TX (US);
Steve McCool, Austin, TX (US);
Denny Hamill, Austin, TX (US);
Dennis Wilson, Austin, TX (US);
Wayne Furlan, Austin, TX (US);
Kevin Walter, Austin, TX (US);
Darrin Willauer, Austin, TX (US);
Karl Martin, Austin, TX (US)

(73) Assignee: NCC NANO, PLLC, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/285,927

(22) Filed: Oct. 5, 2016

(65) Prior Publication Data
US 2017/0027063 A1    Jan. 26, 2017

Related U.S. Application Data

(62) Division of application No. 11/720,171, filed as application No. PCT/US2005/042895 on Nov. 23, 2005, now Pat. No. 7,820,097.

(51) Int. Cl.
*H05K 3/12* (2006.01)
*B41M 3/00* (2006.01)
(Continued)

(52) U.S. Cl.
CPC ......... *H05K 3/1283* (2013.01); *B22F 1/0022* (2013.01); *B22F 3/10* (2013.01); *B29C 35/0805* (2013.01); *B29C 35/10* (2013.01); *B41M 3/001* (2013.01); *B41M 3/006* (2013.01); *B41M 7/0081* (2013.01); *C09D 1/04* (2013.01); *C23C 18/14* (2013.01); *C23C 18/1658* (2013.01); *C23C 18/1667* (2013.01); *C23C 18/1692* (2013.01); *C23C 18/31* (2013.01); *C23C 30/00* (2013.01); *D21H 19/02* (2013.01); *H05K 3/12* (2013.01); *B22F 2001/0033* (2013.01); *B41M 5/0035* (2013.01); *B41M 5/0047* (2013.01); *B41M 5/0064* (2013.01); *B41M 7/0072* (2013.01); *B41M 2205/12* (2013.01); *H05K 2203/0502* (2013.01); *H05K 2203/10* (2013.01); *H05K 2203/1131* (2013.01)

(58) Field of Classification Search
CPC .... B22F 3/10; B29C 35/0805; B41M 5/0047; C23C 18/14; H05K 2203/1131
USPC .......................................................... 419/45
See application file for complete search history.

(56) References Cited

U.S. PATENT DOCUMENTS 9,494,068 B2 * 11/2016 Schroder ............... B82Y 30/00

* cited by examiner

*Primary Examiner* — Jie Yang
(74) *Attorney, Agent, or Firm* — Russell Ng PLLC; Antony P. Ng

(57) ABSTRACT

This invention relates generally to uses of novel nanomaterial composition and the systems in which they are used, and more particularly to nanomaterial compositions generally comprising carbon and a metal, which composition can be exposed to pulsed emissions to react, activate, combine, or sinter the nanomaterial composition. The nanomaterial compositions can alternatively be utilized at ambient temperature or under other means to cause such reaction, activation, combination, or sintering to occur.

7 Claims, 3 Drawing Sheets

(51) Int. Cl.
*C23C 18/14* (2006.01)
*C23C 18/16* (2006.01)
*C23C 18/31* (2006.01)
*D21H 19/02* (2006.01)
*B22F 1/00* (2006.01)
*B22F 3/10* (2006.01)
*C23C 30/00* (2006.01)
*B29C 35/08* (2006.01)
*B29C 35/10* (2006.01)
*C09D 1/04* (2006.01)
*B41M 5/00* (2006.01)
*B41M 7/00* (2006.01)

ELECTRICAL, PLATING AND CATALYTIC USES OF METAL NANOMATERIAL COMPOSITIONS

The present application is a divisional of U.S. patent application Ser. No. 11/720,171, filed on May 24, 2007. Applicants hereby claim benefit of priority under 35 U.S.C. § 120 to U.S. patent application Ser. No. 11/720,171, which is incorporated by reference herein in its entirety and for all purposes.

RELATED PATENT APPLICATIONS

This patent application claims the benefit of the earlier filing dates of U.S. Patent Application No. 60/630,988 (filed Nov. 24, 2004), which application is entitled "Electrical, Plating and Catalytic Uses of Metal Nanomaterial Compositions," having Kurt A. Schroder, Karl M. Martin, Dennis E. Wilson, Darrin L. Willauer, Dennis W. Hamill, and Kevin C. Walter as inventors and US Patent Application No. 60/668,240 (filed Apr. 4, 2005), which application entitled "Method and System for Reacting, Activating and Sintering Nanomaterials," having Steven C. McCool, Kurt A. Schroder and Dennis E. Wilson as inventors.

This application is also related to the following patent applications:

PCT Patent Application No. PCT/US2005/027711, filed Aug. 4, 2005, entitled "Carbon And Metal Nanomaterial Composition And Synthesis" having Kurt Schroder and Karl Matthew Martin as inventors (the "PCT 05/027711 Application"), and claiming benefits of the earlier filing dates of U.S. Patent Application Nos. 60/598,784 (filed Aug. 4, 2005) and 60/620,181 (filed on Oct. 19, 2004), which two provisional patent applications have the same title and named inventors as the PCT 05/027711 Application.

U.S. patent application Ser. No. 10/669,858, filed on Sep. 24, 2003, entitled "Nanopowder Synthesis Using Pulsed Arc Discharge and Applied Magnetic Field," having Kurt Schroder and Doug Jackson as inventors.

U.S. Pat. No. 6,777,639, issued on Aug. 17, 2004, entitled "Radial Pulsed Arc Discharge Gun For Synthesizing Nanopowders," having Kurt Schroder and Doug Jackson as inventors.

Each of the applications and patents identified above are assigned to the Assignee of the present invention and are incorporated herein by reference.

FIELD OF THE INVENTION

This invention relates generally to uses of novel nanomaterial composition and the systems in which they are used, and more particularly to nanomaterial compositions generally comprising carbon and a metal, which composition can be exposed to pulsed emissions to react, activate, combine, or sinter the nanomaterial composition. The nanomaterial compositions can alternatively be utilized at ambient temperature or under other means to cause such reaction, activation, combination, or sintering to occur.

BACKGROUND

In the field of material processing, materials are often heated to cause a particular change in material morphology, a particular reaction to occur, or to cause a phase change. For example, in the area of conductive patterning, formulations or inks containing silver flakes or powder are laid down on a substrate and then heated to cause the particles to fuse and form a conductive line. In such case, the formulation is required to be fluid and often is nonconductive in order to print the pattern while at the end of the processing it must be solid and highly conductive. The heat changes the morphology of the silver to give the desired results. For silver inks, the temperature that the ink and substrate must be heated to in order to cure the ink is a function of the sintering temperature of the silver. For silver, the melting temperature is approximately 960° C. and the sintering temperature is approximately 800° C. This high temperature limits the substrates to materials that are unaffected by the high temperature. Many of the lower cost or flexible substrates such as cellulose (paper), Polyethylene Terephthalate (PET), Polyester and many other plastics cannot withstand these temperatures. Similarly, other components on the substrate, such as organic semiconductors may also decompose at elevated temperatures.

One approach to addressing this limitation is to use higher temperature substrates such as polyimide films. While this does provide a moderately high temperature flexible substrate, it is not necessarily high enough to form highly conductive films. Furthermore, it is expensive and not suitable for low cost applications.

Another approach to solve this problem is to use high loading of silver flakes in a resin or polymer that contracts during curing. This forces the silver flakes together causing them to make electrical contact. This approach has been demonstrated by Dow Corning under the trade name PI-2000 Highly Conductive Silver Ink. While this product appears to work in some applications, it does have some limitations in that it cannot be inkjetted.

Another approach to solving this temperature limitation is to use nanometals that exhibit a reduction in sintering temperature because of their small size. This approach has shown improvements by reducing the processing temperature to approximately 300° C.-approximately 700° C. Generally, to take advantage of the depressed sintering temperature, the particles must be discrete. Most nanometal synthesis processes such as SOL-GEL require chemical surface functionalization of the particles to keep the particles discrete and to prevent them from spontaneously fusing. This chemical surface functionalization generally needs to be volatilized at an elevated temperature that may be higher than the sintering temperature of the silver. Even if the surface functionalization is designed to evaporate below the sintering temperature, the sintering temperature may still be too high to use some of the lower temperature substrates. As the industry tries to lower the processing temperature, it is often done at the expense of the conductivity of the pattern. While it may be possible to use lower processing temperatures, the result is usually a pattern with less than adequate conductivity.

While the above example has been described in the context of conductive inks, there are similar applications where the same problems exist. For example, in catalytic applications, the catalyst is usually bonded to a high temperature substrate. In order for the reaction to occur at an acceptable rate, the catalyst must be at elevated temperatures. These high temperature substrates are often expensive and it is desirable to replace them with lower temperature substrates. Nanomaterials have begun to be used in these applications, because of their high reactivity and lower reaction temperatures. However, they still must operate at temperatures typically above the lower cost substrate's operating temperatures.

Therefore, in the field there exists a need to process materials at lower temperatures to allow more economical substrates to be used. More specifically, there is a need in the conductive patterning market to produce high conductivity patterns on low temperature substrates.

SUMMARY OF THE INVENTION

This invention relates generally to uses of novel nanomaterials composites comprised of relatively unaggregated metals particles. The processes described in the PCT 05/027711 Application produce the new materials in which some of the composites are composed of carbon and a metal while others are composed of an oxide and a metal. These materials, while being unique and novel unto themselves, can be used in unique and novel applications. Additionally, some of the uses have been shown to work with other nanomaterials. The new uses are accomplished by exploiting the unique material properties that exist in nanomaterials. Specifically, it has been observed that nanomaterials have a unique combination of attributes and properties that allow them to be used for electrical and catalytic applications.

The current invention can exploit these properties and reveals novel uses in the area of conductive patterning. For example, the current invention can relate to creating conductive patterns using nanometals at room or relatively low temperatures, using a photonic curing process in conjunction with nanometals to create highly conductive patterns and using nanometals in conjunction with xerographic printing techniques.

One embodiment of the current invention uses the carbon/metal composite to create conductive patterns at room temperature. This is accomplished by either a simple dispersion of the material in water and then printing the dispersion on a paper substrate. Forming conductive patterns on other substrates at room temperature has also been accomplished using other dispersion techniques.

Another embodiment of the current invention relates generally to a novel method for reacting, activating or sintering nanomaterials and combinations thereof. For example, the invention can relate to the processing of nanometal powders, such as nanometals. Metals, such as, but not limited to, silver, copper, gold, platinum, palladium, tin, antimony, indium and lead are examples of materials that may be used. In the current invention nano refers to at least one aspect of the material having dimensions less than about 1 micron. Generally, this dimension is less than about 500 nm, and even more so less than about 100 nm.

Applicants have observed that some nanoparticles, including most metal nanoparticles, are generally very absorbent of photonic radiation. I.e., the particles behave as good blackbodies and have high absorptivity of electromagnetic radiation. Additionally, nanoparticles tend to have lower reflectivity and poorer thermal conductivity as compared to the bulk materials. Nanoparticles also have a much larger surface area to mass ratio and have a low thermal mass individually than micron or larger sized particles. These qualities suggest irradiation of the nanoparticles with a pulsed photonic source, more specifically a broadcast photonic source, could momentarily heat the particles to a very high temperature. (A "photonic source" is a radiation source in the electromagnetic spectrum including, but not limited, to gamma rays, x-rays, ultraviolet, visible, infrared, microwaves, radio waves, or combinations thereof.) This effect is very advantageous, as noted in several examples listed below.

The current invention addresses the limitations described in the prior art by providing a novel method and system for processing nanomaterial. The current invention uses a high powered, pulsed photonic source to process the nanoparticles while minimally affecting the substrate. By such process, this overcomes limitations of the prior art. In the current invention, a film or pattern containing nanomaterial is fabricated on a surface. Such film or pattern may be fabricated using techniques such as inkjet, screen-printing, gravure printing, xerography, stamping, flexography, offset printing, painting, airbrushing, etc. Once the film or pattern has dried on the substrate, the pattern is subjected to a high-powered, pulsed photonic emission source. The high absorptivity of the nanomaterials and low thermal mass of particles causes them to be rapidly heated while the poor thermal conductivity and short pulse length retards the nanoparticles ability to transfer heat to their surroundings. The result is that the particle temperature is increased quickly to temperatures that cause them to fuse. The poor conductivity, low absorptivity and high thermal mass of the substrate insures that much of the energy from the photonic pulse goes into heating up the particles and minimal energy is transferred to the substrate or surrounding components.

By using a method and system that focuses the energy delivery on the film or pattern, the current invention overcomes the limitations of the prior art.

In yet another embodiment, the nanometal is used in conjunction with a photonic source for catalytic applications. Specifically, this can be accomplished at much lower temperatures than current technologies.

DETAILED DESCRIPTION

Ambient Cure Conductive Ink

Figure 1:
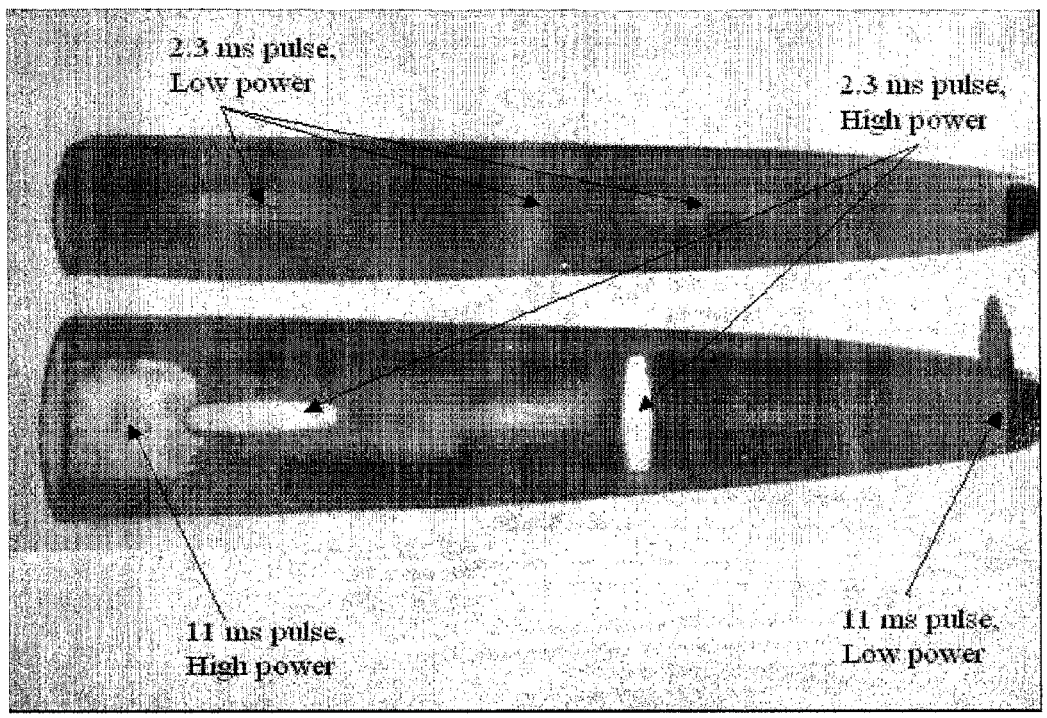
FIG. 1 reflects a portion of a conductive film on PET that was processed using the current invention.

One novel use that is particularly enabled by the carbon/metal nanocomposite material is electroless deposition/plating/printing. In an embodiment of the invention, a conductive ink has been made with the silver/carbon nanocomposite material that will cure and possess metallic conduction without requiring a thermal cure (i.e. ambient room temperature). Such ink can be used for producing metal patterns.

In one embodiment, the silver/carbon composite is combined with de-ionized water and then mixed using zirconia beads in a gyroscopic mixer. The dispersion or ink is then printed on a paper substrate. As the dispersion dries, the material will turn from black to silver in color. Additionally, the resistivity will go from infinite down to approximately 5 times bulk silver. Once dried, the pattern has good adhesion and long-term conductivity.

It is hypothesized that the unique combination of carbon, silver and paper enable the highly conductive pattern to be produced. It is believed that the wicking of the water into the paper creates high hydrostatic pressure gradients that force the particles into intimate contact. Additionally, the carbon which keeps the silver particles apart appears to be more dispersible in the water and tends to wick out with the water leaving the bare silver particles in contact with the paper fibers. When in contact with one another, the bare silver nanoparticles will reduce their surface energy by fusing and thus form a highly conductive pattern that is bonded to the paper fibers. The following example illustrates an embodiment of the invention.

Example 1

Ambient temperature cure silver ink. The ink is comprised of the following components:
Nano Ag Particle Dispersion for ambient cure:
Ag nano particles (25-150 nm BET) 15-45 g
Deionied Water 85-65 g
Zirconia Milling Beads 0.1-1.2 mm 100-150 g
Mix with Gyroscopic Mixing action 30-120 minutes The ink was drawn down on Epson Photo Quality paper with a #10 wire wound rod (1.0 mil wet) to achieve a 0.09 mil (2.3 micron) dry film thickness. Conductivity as shown in Table 1A is achieved within 10-30 minutes.

TABLE 1A

Conductivity of Ag dispersion on porous substrate such as paper, gloss paper and photo paper

| microohm-cm | ohm/□ | ohm/□/mil | Rho Film/Bulk |
|---|---|---|---|
| 18.06 | 0.08 | 0.01 | 11.28 |

This method was applied to other non-porous substrates such as PET, however conductivity was not obtained, as illustrated in Table 1B.

TABLE 1B

Conductivity on Non-porous substrates:

| microohm-cm | ohm/□ | ohm/□/mil | Rho Film/Bulk |
|---|---|---|---|
| Open Circuit | OC | OC | OC |

To address this conductivity issue of coating on non-porous substrates another embodiment is used. In this embodiment, the silver/carbon composite was suspended in a suitable solvent, such as an alcohol. The suspension was treated with an acid, such as HCL. The HCL can etch any oxide that may exist on the surface of the silver and aid in electrostatically stabilizing of the particles. The solution was then sonicated and painted or printed with a variety of printing techniques—such as inkjet, screen transfer, gravure—onto a nonconducting surface, such as paper, plastic, or glass. At ambient temperatures, the solution can dry within a couple minutes and the deposited material can become conductive. Resistivities as low as 36 microohm-cm (around 23 times more resistive than solid silver) have been achieved with this process. Further improvements can be made by slightly heating the sample to about 90° C. for 30 minutes. Tests were conducted over the temperature range of about 25° C. to about 150° C., with improvements seen over the entire temperature range. An advantage of this process is that the solvents evaporate at ambient temperature leaving bare silver particles, which ultimately sinter, at ambient temperatures to form a conductive path.

Example 2

The process can be improved by applying low temperature, much lower than 700° C., which is currently required to sinter flake silver. Results from this embodiment on Mylar are illustrated by Example 2 shown in tables 2A-2C.

TABLE 2A

Formulations of Ag in Isopropyl Alcohol with small amounts of Hydrochloric acid.

| | Formulation | | | | |
|---|---|---|---|---|---|
| | 31-90 | 31-91 | 31-92 | 31-93 | 31-94 |
| Ag 30ST3 (g) | 6.48 | 6.51 | 6.55 | 6.58 | 6.61 |
| IPA (g) | 12.97 | 13.03 | 13.09 | 13.16 | 13.22 |
| HCl (28%) (g) | 0.55 | 0.46 | 0.36 | 0.26 | 0.17 |
| Total (g) | 20.00 | 20.00 | 20.00 | 20.00 | 20.00 |
| Milling Beads | 20.00 | 20.00 | 20.00 | 20.00 | 20.00 |

TABLE 2B

Typical Particle size data on the Horbia 910.

| Horiba 910 Particle Size SLS | EXP 31-94 nm |
|---|---|
| D10 | 135 |
| D50 | 270 |
| D90 | 511 |
| D95 | 603 |
| D95 | 1140 |

TABLE 2C

Conductivity of Ag in Isopropyl Alcohol with small amounts of Hydrochloric acid on PET

| Sample | % Acid (HCl) | Thickness (mils) | Resistivity (microOhm-cm) | Sheet Resistance (Ohms/square) | Sheet Resistance (Ohms/square/mil) | Rho_film/Rho_bulk Ratio |
|---|---|---|---|---|---|---|
| 31-90-avg | 2.80 | 0.017 | 32000 | 7500 | 1.3E+02 | ~20000 |
| 31-91-avg | 2.30 | 0.043 | 63 | 0.582 | 2.5E−02 | 39 |
| 31-92-avg | 1.80 | 0.046 | 50 | 0.423 | 2.0E−02 | 31 |
| 31-93-avg | 1.30 | 0.058 | 36 | 0.248 | 1.4E−02 | 23 |
| 31-94-avg | 0.80 | 0.039 | 45 | 0.457 | 1.8E−02 | 28 |

An embodiment of present invention can also be used to plate metal, such as copper or steel. When plating a metal, an advantage of the HCL is that the substrate is pickled and plated in a single step. Another advantage of this process was the thickness of the plating can be very thick, if desired. 100-micron thick layers have been deposited in a single pass. However, higher conductivity can be achieved with multiple thinner depositions. Since the silver can form a porous, three-dimensional sintered network, the plated material can slightly compress or deform to conform to a surface. This may form a superior electrical or thermal contact. When a vial containing the silver dispersion was allowed to dry, a porous silver "sponge" remained.

In yet another embodiment, other material or particles were placed in this network, to give a coating with unique properties. An example can be dispersing other particles or fibers, such as alumina or zirconia, with the silver solution. The final coating was both electrically conducting and scratch resistant. This was desirable for sliding electrical contacts.

It should be noted that this carbon/silver composite was well suited for ambient thermal cure conducting ink application, as the particles are comparatively devoid of organic ligands, and as compared to other metallic nanoparticle conductive inks. This means the evaporation of the solvent was all that was needed to induce the particles to begin fusing together. With inks that have organics attached to them, a thermal source, typically greater than 300° C., was ordinarily needed to drive off or volatilize the organic before sintering of the nanoparticles can ensue. This is generally undesirable as it adds an additional process step. The heat also potentially damages the substrate and other components (such as organic based devices) in the circuit. Any ink containing particles made by other processes that are comparatively clean on the surface could be used to make a no or low thermal cure ink.

From the aforementioned information, one skilled in the art would recognize the impact of the current invention in that it allows the use of low temperature substrates not currently available for use with common thermal cure processes. This opens a new market by substantially reducing both production and product costs. Generally, the low temperature substrates are less expensive than high temperature substrates. Additionally, the cost associated with purchasing and operating thermal ovens at elevated temperatures was eliminated. The following examples illustrate embodiments of the invention.

Example 3

Ambient cure silver paint was created using 1 g of 30 nm silver with 2% carbon content was poured into a vial containing 2 g of isopropanol and 0.25 g of 37% hydrochloric acid (remainder water). This mixture was shaken and sonicated in a bath for 30 seconds. A ¼" wide artist brush was used to paint the dispersion onto a piece of photocopy paper or similar porous substrate. The trace painted was about 4 microns thick (when dry), a few inches long, and about 7 mm wide. The resistance of the trace immediately after application was greater than 20 megaohms (out of range on the ohmmeter). Over the next two to three minutes, the isoproponal and hydrochloric acid began to evaporate. During this time, the resistance monotonically went down to a few ohms per inch of trace. The conductivity came within 50% its final value 20 minutes after application; and the resistance continued to drop down to about 0.6 ohms per inch of trace over a period of several hours. This corresponded to a resistivity of about 67 microohm-cm or about 45 times more resistive than a solid silver trace. In other units, the resistance of this trace was about 30 milliohm/sq/mil. The temperature during this entire time was about 25 degrees Centigrade. No thermal cure was required. The trace appeared to be bonded to the paper and only delaminated when the bend radius of the paper became less than a millimeter, i.e., a sharp edge. Scotch tape could not pull the trace off the paper. The liquid dispersion used to paint the trace gave consistent conductivity results for at least 3 days after it was synthesized. This example is similar to a screen or gravure printing process.

Example 4

Multiple layers. A thin film of silver nanoparticles was laid down with the technique and ink dispersion of Example 1. After a few hours, the resistance of the 4-inch long trace was 7.6 ohms. A similar trace was painted directly on top of that trace. After a few hours, the resistance of the 4-inch long trace was only 1.0 ohm.

Example 5

No thermal cure ink jet printing. Same recipe as Example 1, except 4 g of isoproponal was used to reduce the viscosity to refill an inkjet cartridge for an Epson Stylus Photo 925 printer. Silver lines as narrow as 100 microns were printed with this printer.

One skilled in the art would recognize that this process can be applied to other metals. Copper is a good example. In this embodiment, two processes formed unaggregated nanopowders; one using the carbon and the other by introducing trace amounts of oxygen during the production process to create an oxide shell around the copper particles. In both cases, the nanoparticles are relatively unaggregated. In this case, the films as produced were not conductive but were conductive when heated at about 150° C. in an inert atmosphere. In the case of copper, the material readily oxidizes such that if an inert atmosphere is not used, non-conductive copper oxide is formed.

Xerographic Printing

While the previous embodiments can use the nanometal dispersed in a solvent which is then printed, there are other methods of printing that use dry powders. For example, laser printing or xerographic printing typically uses powders or toners that are electrostatically deposited onto a substrate and then heated to fuse the particles of the powder to create the desired image. One material attribute for the preset process was that the powders have a high resistivity so that it can be electrostatically charged. Hence, metal powders are not used in this process.

Nanometal powders and in particular the carbon/metal composite material are well suited for this application because the powder has a very high and controllable resistivity. This allows it to be electrostatically transferred in a xerographic process to directly print the metal powder. After the nanoparticles have been transferred to the printer, they can be sintered to form conductive paths with a variety of means such heat, laser, ion beam or ultraviolet, infrared or photonic curing (described below). Hence, a new method of creating patterns is enabled by the nanomaterials. The following examples demonstrate different embodiments of the current invention.

Example 6

The toner from a cartridge from an IBM Laser printer E by Lexmark Type 4019-E01 laser printer was removed and replaced with 10 nm silver with 30% carbon content. The bulk silver powder had very high resistance. Two probes from an ohmmeter were immersed into a jar of the powder with ⅜ inch probe spacing and ½ inch probe depth, the resistance was greater then 20 megaohms (the maximum range of the ohmmeter). The thermal heating element of the printer was disabled to prevent premature burning of the silver. Successful transfer of silver powder was noted on a regular sheet of copy paper. This silver on this sheet of paper would then need to be sintered in order to be conductive. This can be done with a variety of techniques including, but not limited to, mechanical pressure, microwaves, resistance welding, ultrasonic welding, or radiative means such as laser sintering or a flashlamp described in the Photonic Activation of Metallic Nanoparticles section below. Objects such as plastic, wood, textiles and other metals have been plated with this powder using these sintering techniques.

Although the carbon metal composite nanomaterial is particularly amenable to being a xerographic printing toner component for printing conductive paths, other materials may be amenable if they can be made very resistive while in bulk powder form and be made to become conductive after printing. Examples may include metallic particle powder coated with a thin dielectric material that could be volatilized or reacted off after printing to form conductive paths. An example is copper nanoparticles with an oxide layer. Note that this would need to be cured in an inert atmosphere to prevent copper oxide from forming. Fortunately, the techniques described below enable the curing of the film in air.

Photonic Activation of Metallic Nanoparticles

Another embodiment of the current invention includes a method and system for processing nanomaterials to create conductive patterns. The method and system of processing the nanomaterials takes advantage of the unique properties of nanoparticles, as compared to micron or the bulk material. For example, nanoparticles tend to have low reflectivity, high absorptivity, reduced sintering temperatures, higher reactivity and poor thermal conductivity, as compared to the bulk material property. The current invention uses a high-powered, pulsed, broadcast photonic source to process the nanoparticles while minimally affecting the substrate, thus overcoming the limitations of the prior art.

In the current invention, a film or pattern containing nanomaterial was fabricated on a surface. Such film or pattern may be fabricated using techniques such as inkjet, screen-printing, gravure printing, xerography, stamping, flexography, offset printing, painting, airbrushing, etc. Once the film or pattern had dried on the substrate, the pattern was subjected to a high-powered, pulsed photonic emission source. The high absorptivity of the nanomaterials and low thermal mass of particles causes them to be rapidly heated while the poor conductivity and short pulse length retards the nanoparticles ability to transfer heat to their surroundings. The result was that the particles' temperature is increased quickly to temperatures enabling them to fuse. The poor conductivity, low absorptivity and high thermal mass of the substrate insured that much of the energy from the photonic pulse went into heating up the particles and minimal energy was transferred to the substrate or surrounding components. In summary, the energy delivered to the particles happened so quickly that the particles fused before they have time to transfer their heat to the substrate. This natural discrimination capability of the nanoparticles allows a pulsed, broadcast emission to cure a large complex printed pattern in a single flash without damaging the substrate. Typically, this technique deposits of order 1 J/cm^2 on the substrate. This is generally below the damage level for the substrate at the pulse lengths used. For systems which use a continuous laser to sinter metal nanoparticle films of order 100 J/cm^2 is needed. Since this involves depositing a much higher areal energy density, the laser generally needs to be focused only on the printed pattern of the substrate adjacent to the pattern or the substrate will be damaged. Furthermore, the laser curing is a serial process and requires expensive equipment and critically aligned optics. It is possible to use a pulsed laser to accomplish the above as the required areal energy density would be low, and such a technique may even be preferable when curing a small area in a repetitive fashion. A pulsed laser system is less desirable as the area to be cured becomes larger. In this case the pulsed emission from a gas discharge, such as a xenon flash lamp, becomes more desirable. A reason for this is largely economic, as the hardware for gas discharge lamp system is cheap and has a high electrical to light conversion efficiency. This is demonstrated by the fact that a flash lamp is often used to optically pump a laser system. Furthermore, a gas discharge lamp system does not require complex optics and critical alignment as a laser-based system does. Still, pulsed solid-state and other pulsed emission sources are continually becoming more and more economical. Multiple emission sources could be used in parallel to achieve a broadcast effect. Since this curing technology does not place a significant thermal load on the substrate or surrounding components, multi-layer circuits, even with embedded devices, are more practical on thermally fragile substrates such as paper or plastic.

Photonic Curing Process

A method of an embodiment of the invention is to expose the nanoparticles to a pulsed emission source, so as to cause their morphology or phase to change and/or cause the material to react without substantially affecting the substrate that they are contained within or reside on. Several tests were performed to evaluate the effectiveness of curing nanoparticle formulations for conductive inks. In the tests, formulations were prepared by mixing different nanomaterials with various solvents, surfactants and dispersants and producing films or patterns with the formulations. The films and patterns were applied to substrates, subjected to the pulsed emission source and the conductivity, adhesion, surface morphology and curing depth were measured. The conductivity was determined using a four-point probe and thickness gauge. In some cases, the films or patterns were allowed to dry prior to being subjected to the pulsed emission source.

When the film or pattern was subjected to the pulsed emission source, the particles heated-up and sintered. When this happens, it was found that the absorptivity of that portion of the pattern decreased and its reflectivity and thermal conductivity increased. Hence the process was self-limiting. This may imply, in some cases, that it was better to apply a single intense pulse rather than multiple lower intensity pulses. In developing the current invention, the effects of pulse duration and pulse energy were investigated. The total power delivered to the pattern was a function of the pulse energy, pulse duration and optical footprint area. Tests were performed with pulse lengths from 0.7 microseconds-100 milliseconds using xenon flash lamps.

In development, a mixture of approximately 30% mass of Nanotechnologies, Inc. 30 nm silver, 60% mass isoproponal and 10% mass hydrochloric acid was used as the formulation to produce a conductive film on PET. As the pattern dries its conductivity increases to about $\frac{1}{20}^{th}$ of bulk silver. The films were applied to a 3.5 mil matte PET substrate with a "2.5" wire wound draw down bar and allowed to dry. In some cases, multiple passes were made. Typically, three passes yielded a 2-3 micron thick dried film. After subjecting the film to the pulse, in all cases the conductivity increased. Increases in conductivity to approximately $\frac{1}{10}$ and in some cases $\frac{1}{3}$ to $\frac{1}{2}$ the conductivity of silver was observed. In testing, it was generally found that for a given total energy, the patterns processed using a higher power and a shorter pulse length gave better conductivity. Testing also showed that there was a threshold areal energy density, which if exceeded, blows the film off of the PET surface. Tests performed at a given energy above the threshold showed that the samples processed with a long pulse length had substantial thermal damage to the substrate, whereas the samples subjected to the shorter pulse lengths showed minimal or even undetectable thermal damage to the substrate. In this series of tests, the samples subjected to the shorter pulse lengths showed visibly cured silver around the edges of the blown off pattern, whereas the longer pulse length samples did not.

This evidence suggested that the shorter pulse lengths worked better. This information has far reaching implications. For short pulse lengths, it is possible to fully cure a sample without causing significant damage to the substrate. This can remove the thermal limitations of the substrate and allows a wide range of new substrates to be used such as PET, polyester, plastics, polymers, resins, fabrics, non-woven fabrics, paper products and organic compounds. While this process works for low temperature substrates, it is also applicable to high temperature substrates such as ceramics, composites, laminates, glass, silicon and most materials currently being used in the conductive patterning market. One aspect of the substrate that should be reviewed is its absorptivity in the wavelength of the flash emission. Generally, the substrate should not have a high absorptivity in the wavelength range of the flash because if it absorbs the energy of the flash it maybe damaged. If needed, filters can be used to remove the undesirable emission bands. One method to test whether the substrate is affected by the emission is to subject it to the cure conditions without any pattern. The substrate can then be inspected to determine if it has been adversely affected.

Example 7

FIG. 1 shows a portion of a conductive film on PET that was processed using the current invention. The top film shows several places where the film was photonically cured. The lower film shows several places where sufficient energy was used to blow the film off the substrate. Notice, that substantially more damage occurs at the longer pulses.

Example 8

Figure 2:
FIG. 2 shows another film with a cured central region.
Figure 3:
FIG. 3 shows an example where only the right half of the film has been photonically cured.

FIG. 2 shows another film with a cured central region where the conductivity was ⅓ to ½ that of bulk silver. Note the indentations from the four-point probe used to measure its resistivity. This process was also performed on formulations of silver and isoproponal using different size particles ranging from 25 nm-200 nm. In these cases, the pattern had infinite resistance, greater than 40 Megaohms, or a non-detectable conductivity after drying. In all cases, once the pattern was subjected to the photonic curing, the conductivity increased to within several orders of magnitude and generally within two orders of magnitude of bulk silver. In some cases the conductivity was within an order of magnitude of bulk silver. FIG. 3 shows an example where only the right half of the film has been photonically cured.

Example 9

A thin film of silver nanoparticles (with the ink recipe from Example 1 of Section 1 (No Thermal Cure Conductive Ink) above, but with 10% ethylene glycol by weight, was laid down onto a cellulose substrate (paper) and allowed to dry. The electrical resistance of the film was approximately 612 ohms. When a flash of light from the xenon flash bulb of a disposable photographic camera (Studio 35 Single Use Camera [27 exposures] distributed by Walgreen Co, Deerfield, Ill. 60015-4681) is initiated about ½" from the film, the resistance immediately goes down to 440 ohms. Subsequent flashes approximately 1-minute apart yielded resistances of 401, 268, 224, and 221 ohms respectively.

Example 10

Similar films of nanosilver (with the ink recipe from Example 1 of Section 1 Ambient Cure Conductive Ink) above, were laid down on a cellulose substrate and allowed to dry for about 25 minutes. The film #1 had an initial resistance of about 3.7 ohms. One flash from a camera flash (described above) at ¼ inch-½ inch immediately dropped the resistance down to 3.3 ohms. A second flash one-minute later dropped the resistance down to 2.5 ohms. A subsequent flash one-minute later did not drop the resistance noticeably. The second film was placed in an oven at 140 degrees centigrade for 15 minutes. Its resistance dropped from 5.3 to 4.0 ohms. Two subsequent flashes from the camera dropped the resistance of the film down to 3.9 and 3.8 ohms, respectively. In effect, a few strobe flashes on the substrate appear to be a desirable substitute for a low temperature thermal cure.

Example 11

A film of silver nanoparticles was made and allowed to dry at approximately 25 degrees centigrade for 10 days. One flash from the camera at ½ inch from the surface dropped the resistance from about 67 to about 61 ohms instantly.

Example 12

When the camera strobe was placed within ⅛ inch from the substrate 15 minutes after applying the silver film and 10 minutes after the film appeared dry, there was audible pop when the strobe is initiated. In this case, a finger placed on the opposite side of the paper can feel a pop when the camera is initiated. When viewed under the microscope, portions of the film have been blown off. Presumably, this is due to the rapid expansion of gas next to the surface of the heated nanoparticles. Since a loud pop and associated pressure pulse on the paper is also noticed on 4-day-old film, the source for the gas is likely not unevaporated solvent. This suggests that if intense photonic sources are used, the laid down film should be thin or the substrate should be flooded with the photonic source in a vacuum.

Example 13

Several silver inks were produced using different solvents and the subjected to the photonic curing process. Additionally, the effects of adding binders to promote adhesion of the ink to the substrate where tested. The first example was shown in Table 3A in which a silver ink was made from Methyl Ethyl Ketone. The film thicknesses were drawn down on PET to a thickness of 0.09 mil or 2.29 microns. The results of various areal energy densities and pulse width were explored using a prototype photonic cure system. The data shows that there is an optimal combination of areal energy density and pulse length to give the best conductivity.

TABLE 3A

Photonically cured Ag films made from Ag Methyl Ethyl Ketone dispersions

| Areal Energy Density (J/cm$^2$) | Pulse Length (micro-second) | MicroOhm-cm | ohm/□ | ohm/□/mil | Rho Film/Bulk |
|---|---|---|---|---|---|
| 0.86 | 300 | 97 | 0.42 | 0.04 | 60 |
| 1.03 | 300 | 63 | 0.27 | 0.03 | 39 |
| 1.12 | 300 | 51 | 0.22 | 0.02 | 32 |

TABLE 3A-continued

Photonically cured Ag films made from Ag Methyl Ethyl Ketone dispersions

| Areal Energy Density (J/cm$^2$) | Pulse Length (micro-second) | MicroOhm-cm | ohm/□ | ohm/□/mil | Rho Film/Bulk |
|---|---|---|---|---|---|
| 1.22 | 300 | 49 | 0.21 | 0.02 | 30 |
| 1.42 | 300 | 56 | 0.24 | 0.02 | 35 |
| 0.38 | 300 | 1230000 | 5300 | 480 | 768000 |
| 0.63 | 300 | 2400 | 10.6 | 0.96 | 1500 |
| 1.65 | 100 | 133 | 0.58 | 0.05 | 83 |
| 1.38 | 100 | 64 | 0.28 | 0.03 | 40 |
| 1.13 | 100 | 49 | 0.21 | 0.02 | 31 |
| 0.90 | 100 | 61 | 0.27 | 0.02 | 38 |
| 0.70 | 100 | 87 | 0.38 | 0.03 | 54 |
| 0.48 | 100 | 254 | 1.10 | 0.10 | 59 |
| 0.31 | 100 | 590000 | 2600 | 230 | 370000 |
| 0.88 | 30 | 150 | 0.67 | 0.06 | 97 |
| 1.32 | 30 | 90 | 0.39 | 0.04 | 56 |
| 1.42 | 30 | 70 | 0.30 | 0.03 | 44 |
| 0.69 | 30 | 1140 | 0.63 | 0.06 | 90 |
| 0.53 | 30 | 290 | 1.27 | 0.12 | 183 |
| 0.39 | 30 | 4800 | 20 | 1.90 | 3000 |
| 1.05 | 30 | 130 | 0.56 | 0.05 | 80 |

Another example as shown in Table 3B uses silver dispersed in water on Photo grade InkJet paper at 2.3 microns, with various types of curing, about 25° C. for 30 minutes, about 90° C. for 30 minutes, and Photonic cure. In this example, three films were created from the same formulation. One film was subjected to a temperature cure of 93° C. for 30 minutes and the other the photonic cure process. The last sample was used as a baseline. Notice that the photonic cure sample obtained approximately 5× bulk silver resistivity and was slightly better than the thermal cure. Additionally, the thermal cure results are quite good for this low temperature.

TABLE 3B uses silver dispersed in water on Photo grade InkJet

| Cure | Areal Energy Density (J/cm$^2$) | Pulse Length (micro-second) | MicroOhm-cm | ohm/□ | ohm/□/mil | Rho Film/Bulk |
|---|---|---|---|---|---|---|
| 25° C. | 0 | 0 | 19 | 0.09 | 0.01 | 12 |
| 93° C. | 0 | 0 | 10 | 0.05 | 0.004 | 6.5 |
| Photonic Cure | 0.73 | 30 | 8 | 0.04 | 0.001 | 5.1 |

Yet another example shown in Table 3C shows silver dispersed at 10% binder loading coated on Mylar at 2.3 microns. In this example different binders were incorporated to improve adhesion to the substrate. The samples were then subjected to the photonic cure process. A significant result is that the binders allow high power to be applied to the samples before they blow off the film. The higher power also increases the ability of the ink to cure.

This example shows silver dispersed at 10% binder loading coated on Mylar at 2.3 microns. In this example, different binders were incorporated to improve adhesion to the substrate. The samples were then subjected to the photonic cure process. A significant result is that the binders allow high power to be applied to the samples before they blow off the film. The higher power also increases the ability of the ink to cure.

TABLE 3C

Example 13D: Ag dispersed at 10% binder loading coated on Mylar at 2.3 microns

| Polymer System | Areal Energy Density (J/cm$^2$) | Pulse Length (micro-second) | MicroOhm-cm | ohm/□ | ohm/□/mil | Rho Film/Bulk |
|---|---|---|---|---|---|---|
| Acrylic Pressure Sensitive Adhesive H$_2$O | 0.56 | 300 | 78.7 | 0.344 | 0.014 | 49 |
| Vinyl Acetate Ethylene Adhesive H$_2$O | 0.65 | 300 | 37 | 0.285 | 0.015 | 23 |
| Acrylic Clear Coat Solvent | 1.12 | 300 | 84 | 0.363 | 0.033 | 52 |
| Urethane Clear Coat Solvent | 0.78 | 300 | 47 | 0.365 | 0.019 | 30 |

While the tests were performed using Nanotechnologies, Inc.'s dry silver powder, the process should also be effective on silver synthesized with a surface functionalization such as material from a SOL-GEL process. In this case, the photonic process will heat the particles to a high temperature, which will volatize the surface organic compounds and allow the particles to sinter. Furthermore, the photonic process could be used to augment the conductivity of a film that has already been partially or completely cured with a thermal process. The photonic process overcomes the limitations of the prior art by separating the heating of the formulation from the heating of the substrate and allows the surface functionalization to be volatilized by the heated particles.

The photonic curing process has other unique benefits. Materials, such as copper and zinc, that readily oxidize, are typically not used to make conductive patterns. If an ink or formulation is created using materials such as these metals and then heated to cure the pattern, the metal will oxidize in the presence of oxygen and form a poorly conductive or nonconductive metal oxide pattern. During the heating process, the oxidation of the particles occurs at a lower temperature than sintering, hence the particles convert to the metal oxide before they sinter. This issue is typically addressed by processing in a vacuum or in an inert or reducing atmosphere such as hydrogen. All of these options are expensive and make these materials unattractive to the conductive patterning market.

The current invention overcomes the limitation of using readily oxidizing and or reactive material by allowing the nanomaterials to be processed without a controlled environment. Tests were performed using copper nanoparticles in the range of 30 nm-100 nm. Tests were performed on copper with an oxide passivation layer as well as a copper/carbon composite material.

Example 14

Figure 4:
FIG. 4 shows a sample of the present invention obtained by optimizing the particle oxide layer and photonic conditions such that conductive of bulk copper is approached.
Figure 4:

In the tests, the nanocopper was dispersed in isoproponal, spread onto a sheet of PET and allowed to dry. The coating was black in color and had almost infinite resistivity. The coating was subjected to a 2.3 ms xenon broadcast flash and the material immediately turned copper in color and the conductivity increased to $1/100^{th}$ that of bulk copper. Another sample subjected to a higher-powered flash showed conductivity results that were $1/40^{th}$ that of bulk copper. Better results should be obtained by optimizing the particle oxide layer and photonic conditions such that conductive of bulk copper is approached. One such sample is shown in FIG. 4, which shows uncured copper film and film after photo curing. It is speculated that because of the inherent properties of the nanocopper, the particles are heated and sintered in a time scale that is much faster than the time scale for oxidation such that minimal oxidation occurs. This has significant and far-reaching implications. The current invention allows inexpensive materials that had previously been discounted because of oxidation issues to be used in existing and new applications. Material, such as but not limited to metals and transition metals like copper, iron, zinc, titanium, zirconium, magnesium, tin, aluminum, nickel, cobalt, indium, antimony, and lead tray be usable. In addition these materials can be used on low temperature substrates as well as high temperature substrate.

With this process it may also be useful to use combinations of materials or alloys of materials. Combinations of materials may allow expensive and inexpensive materials and highly conductive and moderately conductive materials to be processed to tailor costs and conductivity. Additionally, it may be possible to mix two or more compounds such that when they are heated they react or form an alloy.

Some alloys when formed may release energy that helps to further sinter the material. For example a test was performed using copper with an oxide layer and a small amount of nano-aluminum. In this case, the copper oxide and aluminum when heated will result in a thermitic reaction. This reaction releases a substantial amount of heat that aids in further heating and sintering the copper. A side benefit is that the products of the reaction are copper and alumina. Hence the copper oxide on the surface of the particles in converted to copper resulting in better conductivity.

In yet another embodiment, it is recognized that larger particles may be able to be used if they have a favorable morphology such as being highly agglomerated, possess nanopores or have extreme surface roughness that makes them highly absorptive. Also, one could mix a small amount of tiny particles with larger ones to increase the effective absorptivity. Mixing a small amount of nanoaluminum with some micron-sized copper, laying a film of the mix on paper, and photonically curing it to render the film electrically conductive demonstrated an embodiment of this concept. In this case, it was very difficult to photonically cure the micron-sized copper alone as the copper had a low surface area to mass ratio and had low absorptivity of the radiation emitted from the xenon strobe. The combustion of the nanoaluminum provided the additional energy needed to sinter the copper. The photonic initiation of aluminum is disclosed in PCT Patent Application No. PCT/US2005/038557, filed Oct. 25, 2005, entitled "System for Photonic Initiation of Nanoenergetic Materials" having Dennis E. Wilson and Kurt A. Schroder as inventors, which application is incorporated herein by reference. Other variants include adding additional oxidizer such as copper oxide or iron oxide to the mix, passivating the copper to provide oxidizer for the aluminum directly on the particles to be sintered, or adding carbon black, or some other nanoscale emissive material, to the mix to make the film absorptive of the photonic radiation.

Example 15

A conductive pattern was successfully producing using a film comprised of 10 micron silver flake (which has very low absorptivity) with 5-10% by weight, 40 nm silver. Specifically, the resistance of the trace went from infinite to 3 ohms with a single 2.3 ms strobe flash. In this case, it is believed that the nanopowder acts as a sintering aid.

While most of the processed conductive films have been fairly thin, less than 10 mils, it may be possible to use the current invention for thicker films. In these cases, a longer wavelength and possibly longer duration pulse would be desirable.

Most nanopowders and/or nanoparticle dispersions often have a discrete particle distribution that may be log normal, narrow, broad or modal. Since the sintering temperature is a function of the particle size, there may be a range of temperatures that cause the particles to sinter for a given powder. When the film is subjected to the emission source, it is possible that some of the particles are vaporized, some are melted, some are sintered and some are just heated. Recognizing this, another embodiment of the current invention uses multiple emissions to cure the sample. In this embodiment, the emissions are controlled to moderate the amount of sintering. For example, the film is subjected to a lower powered pulse to sinter the smaller particles and then followed by higher powered pulse or sequence of pulses to sinter the larger particles. If a high intensity pulse is used initially, it is possible that the smaller particles are vaporized which would result in poor film uniformity such as voids and performance. A test was performed to determine if multiple pulses work. The sample was subjected to multiple pulses of increasing intensity. After each pulse, the conductivity was measured and found to increase after the first several pulses. After approximately 5 pulses, the conductivity no longer increased.

It was observed in the initial testing that an audible pop can be heard when a strobe is flashed near the nanomaterial sample. This occurred with the loose nanoaluminum powder or loose nanosilver powder. The pop becomes louder as the strobe becomes closer to the substrate. Additionally, the audible pop can be used as a feedback mechanism for the strobe intensity for curing the film. Here, a fresh film pops more easily, as it has a very high emissivity and a very low thermal conductivity. As the film is cured, the particles begin to sinter, which makes the emissivity lower and the thermal conductivity higher. Thus, a flash from a strobe of the same intensity makes less of a pop. The resulting film is now able to take a higher intensity pulse without being destroyed. Likewise, a higher intensity pulse is needed to further cure the film. Since the gas is the primary reason the intensity of the strobe can be high initially, an alternative approach would be to flash the substrate in a vacuum. In this environment, the ultimate conductivity may become higher as convection is eliminated as an energy transfer mechanism. In this case the film can stay hot longer and sinter more fully.

This photonic cure technique may be used in parallel with thermal curing means to augment the results and achieve the same results at a lower cure temperature than without the photonic curing.

Photonic Curing System

The following describes a commercial photonic curing system capable of high-volume processing of conductive patterns on low-temperature substrates including flexible circuit boards, flat panel displays, interconnects, RF-ID tags, and other disposable electronics. The commercial system described is capable of processing products spanning 34" in width moving at a rate of 100 feet per minute. The same design scales to higher speeds and wider formats with a cost that increases less than linearly with area processed per unit time.

Figure 5:
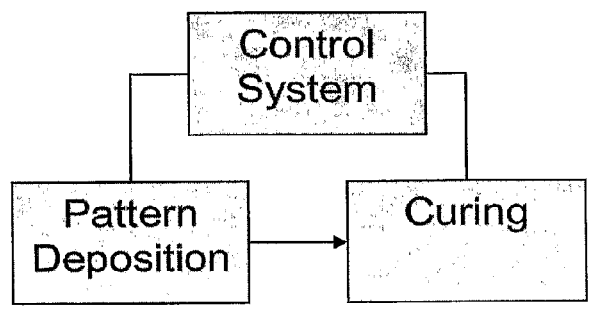
FIG. 5 shows a process diagram of an embodiment of the invention.
Figure 6:
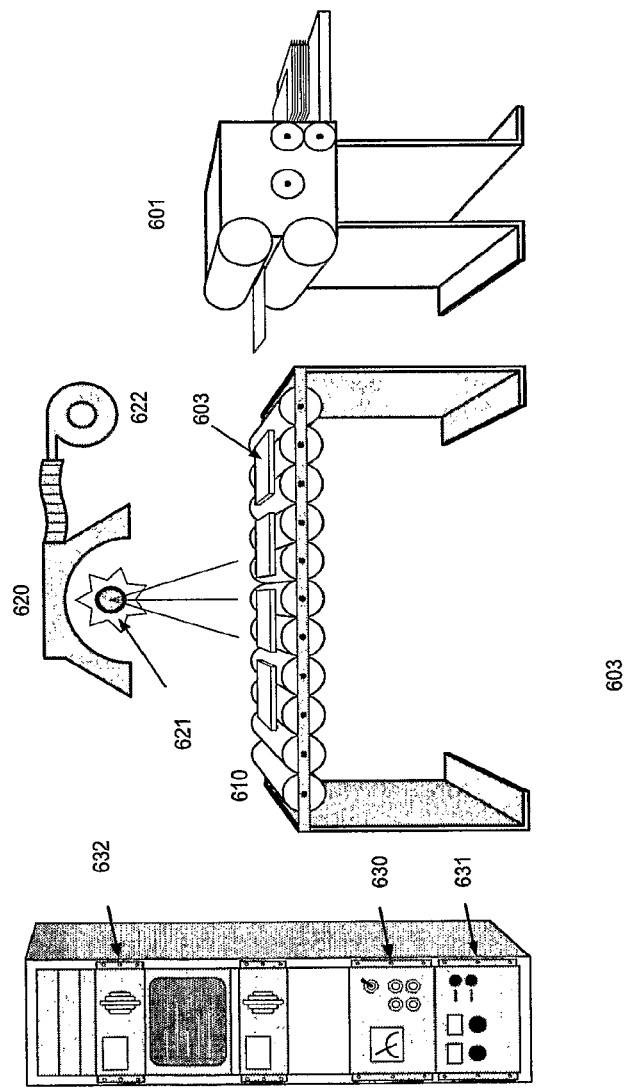
FIG. 6 shows a schematic of the production system.

FIG. 5 shows a process diagram of an embodiment of the invention, and FIG. 6 shows a schematic of the production system. The photonic curing system cures metallic nano-inks on a wide variety of substrates. The multi-strobe head is driven by a high voltage power supply and trigger circuit, which is mounted in a standalone relay rack. The height of the strobe head can be adjusted to control the strobe footprint. The exposure level is adjusted electronically via the strobe power supply. Both the strobe energy and pulse duration are adjustable to allow optimum curing without substrate damage depending on the uncured ink emissivity, material properties, and ink thickness.

The system is comprised of a process for making films and patterns 601 that will be processed to produce conductive patterns and a system for curing the films and patterns to create a conductive film or pattern. The system for creating the film or pattern 601 on the substrate could be one or combinations of existing technologies such as screen printing, inkjet printing, gravure, laser printing, xerography, pad printing, painting, dip pen, syringe, airbrush, lithography that are capable of applying nanoparticles to a surface. The system would then move the substrates with the pattern to the photonic curing system 602 where the film is cured. An embodiment of the invention is capable of operating with various substrates. The system is capable of continuously processing samples at 100 ft/min. with uniform coverage or double that rate with reduced uniformity.

This system uses a method of moving the samples 603 past the strobe head 620, although it may be possible to move the strobe head 620 relative to the samples. The current invention uses a conveyor belt system 610 with a width capable of handling samples of approximately 90 cm××150 cm. It is used to move the samples under the photonic cure device. The conveyer belt 610 operates at speeds from 5 to 200 ft/min and is controlled by the conveyor controller 632. One skilled in the art would recognize that other conveyance methods such as robotics and pneumatics could be used to move the samples.

The photonic cure system 602 contains a photon emission source such as a xenon flash lamp 621 in the strobe head 620 connected to an adjustable power supply 630. The adjustable power supply has an energy capability of 5-600 Joules with a pulse duration of 1 microsecond-100 milliseconds. While there are some "flash" technologies that use pulses in the 2 seconds to several minutes to cure resins, one skilled in the art would recognize that if the pulse is too short in these applications there is little if any effect or the entire product, substrate and film is heated. The current invention distinguishes itself from these systems by using pulses that are orders on magnitude shorter than current systems and are designed to interact with the nanomaterials. The flash lamp 621 or array of flash lamps is configured to produce a 90 cm wide by 1-3 cm strobe pattern. The intensity of the strobe is varied by changing the height from the sample from approximately 1-30 cm. The adjustable power supply 630 is controlled by the strobe control 631 to provide a single pulse to pulses at a frequency of approximately 40 Hz. A blower 622 or other cooling means such as liquid is connected to the strobe head to cool and extend the life.

One skilled in the art will recognize that there are other options for creating the pulse emission. Devices such as a pulsed laser, chopping an intense light source, light deflection methods such as mechanical or electrical deflection, pulsed arc, etc. can be used to create the emission. While the current invention shows the samples 603 being subjected to the emission source from the top, it is possible to subject the film from the bottom or combination of top and bottom. The current invention also shows that the samples are subjected to the emission after they have dried. It may be beneficial to submit the films to the emission source when they are wet. Additionally, the system may be configured to automatically determine the optimal settings by progressing through a series of production parameters and measuring the conductivity of each configuration. The product settings would then be set to the parameters that give the best film properties.

In operation, the products 603 are produced by the film and pattern printer 601 and moved on to the conveyor 610. The conveyor 610 moves the product 603 under the strobe head 620 where they are photonically cured by rapid pulses from the flash lamp 621. The strobe power, duration and repetition rate are controlled by the strobe control 631 whereas the conveyor control 630 determines the speed at which the products are moved past the strobe head 620. The samples are then removed from the conveyor 610 for the next step of processing.

One skilled in the art would recognize that the current invention could be used in conjunction with other curing methods. This technique may be used in parallel with thermal curing means in order to achieve the same results at a lower cure temperature and at faster rates. In fact, a test was performed on several conductive patterns that had been printed and cured. The patterns were subjected to a xenon flash and the conductivity increased by a factor of two.

Photon Activated Catalysis

Applicants have observed that some nanoparticle powders, including most metal nanopowders, are generally very absorbent of photonic radiation. That is, the powder is a good blackbody. The nanoparticles also have a much larger surface area to mass ratio than micron or larger sized particles. Finally, the thermal conductivity of a bulk nano-powder is very poor as compared to the bulk material. These three qualities suggest that irradiation of the nanoparticles with a pulsed photonic source could momentarily heat the particles to a very high temperature. (A "photonic source" is a radiation source in the electromagnetic spectrum including, but not limited to gamma rays, x-rays, ultraviolet, visible infrared, microwaves, radio waves, or combinations thereof.) This effect is very advantageous as noted in several new applications listed below.

In general, the catalytic activity of a material increases as the surface area and the temperature of the material increase. A natural result of the first item is that catalytic materials tend to have high surface area. One way to do this is to have catalytic materials with nanoscale dimensions. As a result of the second item, many catalytic processes are performed at high temperature. Many catalytic materials are manometer-sized metals and are therefore very absorbent of radiation. By flooding the catalysts with a photonic source, they will absorb the radiation and heat up to a higher temperature than the rest of the system. Thus, higher catalytic activity can be attained without significantly changing the temperature of the system. This is especially true if a pulsed photonic source is used.

Example 16

"Instant on" or cold start catalysis: A significant portion of the pollution generated by an internal combustion engine comes from the first minute or two of operation. Thus, during the first minute of operation, an automobile's catalytic converter does very little catalytic converting since it is cold. Preheating the whole catalytic converter may require the need for an additional battery, which would somewhat defeat the purpose of the doing it in the first place. However, a repetitive, pulsed intense photonic source could instantly preheat the catalytic material with very little input energy until the entire engine is heated up resulting in dramatically lower emissions from the engine.

Example 17

High catalysis rates in low temperature environments. Environments in which high temperature cannot be tolerated or is not desired, such as a liquid environment, can have increased catalytic activity of being flooded by a photonic source. This can be done without significantly changing the temperature of the system. High yield catalytic cracking of water could be done at temperatures below the boiling point of water.

Example 18

Modulated catalysis. By controlling the intensity of the impinging photonic source, the catalytic activity of a catalyst can be controlled on a short time scale and done so independent of the temperature of the system. The control of the catalytic activity could be from a feedback from another subsystem. This results in an "on demand" chemical reaction such as that which would be desired from a fuel cell or an industrial chemical synthesis process.

Example 19

Cleaning poisoned catalysts. By exposing nanomaterial catalysts to an intense pulsed photonic source the nanoparticles will momentarily be heated. Any adsorbed materials on the surfaces will be driven off or reacted to reactivate the catalyst.

Example 20

Pulsed broadcast irradiation of a nanoparticle aerosol for catalytic synthesis. By exposing nanopowders suspended in a gas to irradiation, the gas in which the particles are suspended may catalytically react with the particles. This may be an effective method for cracking hydrocarbon gases.

While many of the tests were performed with silver, the applicants recognize that other metals will exhibit the same effects and have similar performance. Other metals include but are not limited to copper, aluminum, zirconium, niobium, gold, iron, nickel cobalt, magnesium, tin, zinc, titanium, hafnium, tantalum, platinum, palladium, chromium, vanadium and alloys of the metals. Additionally, non-metallic compounds such as carbon also exhibit these attributes.

It should be appreciated by those of skill in the art that the techniques disclosed herein represent techniques discovered by the inventors to function well in the practice of the invention, and thus can be considered to constitute exemplary modes for its practice. However, those of skill in the art should, in light of the present disclosure, appreciate that many changes can be made in the specific embodiments that are disclosed and still obtain a like or similar result without departing from the spirit and scope of the invention.

What is claimed is:

1. A system for sintering materials, said system comprising:
    a flashlamp configured to generate a plurality of electromagnetic emission pulses for irradiating a film on a substrate in ambient air in order to sinter said film on said substrate such that the conductivity of said film on said substrate increases by at least two-fold, wherein said substrate includes a material having at least one dimension less than 1 micrometer, wherein said film includes at least one metal; and
    a control circuit for controlling said flashlamp to limit an areal energy density of each of said electromagnetic emission pulses to within the order of 1 Joules/cm$^2$, and to limit a duration of each of said electromagnetic emission pulses to be between one microsecond and one hundred milliseconds.

2. The system of claim 1, wherein said system further includes a printer for printing said film on said substrate using a formulation having a metal with at least one dimension less than 1 micrometer.

3. The system of claim 2, wherein said at least one metal is copper.

4. The system of claim 1, wherein said substrate has a decomposition temperature below 450 degrees Celsius.

5. The system of claim 1, wherein said substrate includes a substance selected from the group consisting of PET, polyester, plastics, polymers, resins, paper products, laminates and combinations thereof.

6. The system of claim 1, wherein said flash lamp is a xenon flash lamp.

7. The system of claim 1, wherein said system further includes a conveyor for moving said substrate.

* * * * *

UNITED STATES PATENT AND TRADEMARK OFFICE
CERTIFICATE OF CORRECTION

PATENT NO. : 9,907,183 B2  
APPLICATION NO. : 15/285927  
DATED : February 27, 2018  
INVENTOR(S) : Schroder et al.

Page 1 of 1

It is certified that error appears in the above-identified patent and that said Letters Patent is hereby corrected as shown below:

On the Title Page

Item (62) Related U.S. Application Data, please replace:
"Division of application No. 11/720,171, filed as application No. PCT/US2005/042895 on Nov. 23, 2005, now Pat. No. 7,820,097"
With:
--Division of application No. 12/885,015 filed on Sept. 17, 2010, now Pat. No. 9,494,068--

Signed and Sealed this
Second Day of June, 2020

Andrei Iancu
*Director of the United States Patent and Trademark Office*